United States Patent [19]

Takagi et al.

[11] Patent Number: 5,449,418
[45] Date of Patent: Sep. 12, 1995

[54] METHOD OF FORMATION OF MAGNETOSTRICTIVE LAYER AND STRAIN SENSOR USING SAME

[75] Inventors: Makoto Takagi, Okazaki; Fusao Hirose, Kariya; Hideshi Mori, Chiryu; Nozomu Okumura; Toru Imura, both of Nagoya, all of Japan

[73] Assignee: Nippondenso Co., Ltd., Kariya, Japan

[21] Appl. No.: 72,755

[22] Filed: Jun. 7, 1993

[30] Foreign Application Priority Data

Jun. 9, 1992 [JP] Japan .................... 4-149390
Nov. 24, 1992 [JP] Japan .................... 4-313604
May 28, 1993 [JP] Japan .................... 5-126950

[51] Int. Cl.$^6$ ............................ G01B 7/24
[52] U.S. Cl. ................... 148/304; 428/638; 73/779; 73/862.625; 73/862.69
[58] Field of Search ............ 324/209; 73/779, 862.625, 73/862.69, DIG. 2; 148/304; 428/637, 638

[56] References Cited

U.S. PATENT DOCUMENTS

| | | | |
|---|---|---|---|
| 4,627,298 | 12/1986 | Sahashi et al. | 324/209 |
| 4,763,030 | 8/1988 | Clark et al. | 73/862.69 |
| 4,785,671 | 11/1988 | Wakamiya et al. | 73/779 |
| 4,920,806 | 5/1990 | Obama et al. | 73/779 |
| 5,092,182 | 3/1992 | Ikeda et al. | 324/209 |
| 5,194,806 | 3/1993 | Obama | 324/209 |

FOREIGN PATENT DOCUMENTS

| | | |
|---|---|---|
| 450933 | 10/1991 | European Pat. Off. ......... 73/862.69 |
| 61-15942 | 1/1986 | Japan .................... 148/304 |
| 63-280476 | 11/1988 | Japan . |
| 1-209773 | 8/1989 | Japan . |
| 3-160337 | 7/1991 | Japan . |
| 91-13450 | 9/1991 | WIPO .................... 423/637 |

OTHER PUBLICATIONS

Hirose, F., Mori, H., Takagi, M. and Imura, T., Characteristics of Amorphous Layer Formed By Laser-Quenching, Digests of the 16th Annual Conference on Magnetics, Nov. 7, 1992.
William Fleming et al, "Noncontact Miniature Torque Sensor for Automotive Application", SAE Technical Paper Series, Feb. 22–26, 1982, pp. 47–62.
I. Sasada et al, "Torque Transducer with Stress-Sensitive Amorphous Ribbons of Chevron-Pattern", IEEE Transactions of Magnetics, vol. MAG-20 No. 5, Sep. 1984, pp. 951–953.
M. Sahashi et al, "A New Contact Type Amorphous Torque Sensor with wide Dynamic Range and Quick Response".
K. Harada et al, "A New Torque Transducer Using Stress Sensitive Amorphous Ribbons", vol. MAG-18, No. 6, Nov. 1982, pp. 1767–1769.

Primary Examiner—George Wyszomierski
Attorney, Agent, or Firm—Cushman, Darby & Cushman

[57] ABSTRACT

A strain sensor for detecting strain in automobiles, robots, and the like includes a magnetostrictive layer. The magnetostrictive layer is formed by irradiating an alloy layer with a high energy density beam (such as a laser) to form a magnetostrictive layer having an amorphous structure. The resulting magnetostrictive layer has a magnetic inductance in the direction of irradiation that is much higher than in a perpendicular direction thereof. Using such a sensor, it is possible to selectively detect components of stresses and strains in a given direction.

9 Claims, 14 Drawing Sheets

LASER BEAM SCANNING DIRECTION A

←100μm→

←50μm→

METHOD OF FORMATION OF MAGNETOSTRICTIVE LAYER AND STRAIN SENSOR USING SAME

BACKGROUND OF THE INVENTION

1. Field of the Invention

The present invention relates to a method of formation of a magnetostrictive layer and to a strain sensor, wherein a magnetostrictive layer is formed for use for detection of strain in torque sensors, strain sensors, etc. in automobiles, robots, electrically powered machinery, etc.

2. Description of the Related Art

In the control of automobiles, robots, electrically powered machinery, etc., the accurate, quick detection of the torque of the rotational drive system and the stress-strain of different members is important. As a method for detecting the strain caused in substances due to such force, pressure, torque, etc., consideration has been given to sensors which use the magnetostrictive effect of amorphous magnetic alloys. As the features of such sensors, mention may be made of possible noncontact detection, possible simple structure and small size, and high sensitivity.

In construction, a strain sensor using the magnetostrictive effect of amorphous magnetic alloys is comprised of a detected member having on its surface a magnetostrictive layer comprised of an amorphous alloy and a magnetic sensing portion disposed a certain distance from the same.

As the method for formation of the amorphous alloy layer, consideration has been made of the method of adhering an amorphous alloy ribbon on the surface of the detected member by a resin and the method of imparting shape magnetic anisotropy at that time, but there are problems in the bonding strength, such as peeling, and the characteristics decline as the temperature rises, so the reliability is poor. Further, when an amorphous alloy ribbon is bonded by welding or soldering, the bonding strength is improved compared with adhesion by a resin, but the amorphous alloy layer ends up crystallizing and therefore the magnetic characteristics end up greatly degraded. The method of formation of an amorphous alloy layer by the sputtering method or other vapor deposition methods increases the manufacturing costs due to the slow speed of film formation and the large facilities needed and also there are problems in the bonding strength.

Therefore, the method has been devised of forming an alloy layer with a high glass-forming ability on the surface of the detected member by the hot isostatic press (HIP) or other method, then irradiating a high energy density beam in a stripe manner to leave alternate unirradiated portions, make partially amorphous only the irradiated portions on the surface by the melting and rapid quenching accompanying this, and thereby impart shape magnetic anisotropy (for example, see Japanese Unexamined Patent Publication (Kokai) No. 63-280476 and Japanese Unexamined Patent Publication (Kokai) No. 3-160337).

In the above method, however, problems ended up occurring such as the decline in strength due to the nonuniformity accompanying the difference in the mechanical properties of the irradiated portions and the unirradiated portions and the fact that since magnetic flux mainly flows only at the irradiated portions, while shape magnetic anisotropy is induced, the sensor output (sensitivity) is not improved that much.

Further, a method of irradiating a high energy density beam on a cold paramagnetic steel material to form a magnetostrictive layer by the accompanying surface reformation is described in Japanese Unexamined Patent Publication (Kokai) No. 1-209773, but it is described in that publication that the irradiation should be performed so that adjoining beam-treated lines should not overlap over half of their widths. A magnetostrictive layer obtained by reforming such a cold paramagnetic steel, however, is considerably inferior in magnetic permeability and other soft magnetic characteristics compared with a magnetostrictive layer comprised of an amorphous alloy, so a high sensor sensitivity cannot be obtained. Further, the sensor sensitivity does not necessarily become high when the overlap between beam-treated lines is less than half of their widths.

In the above way, in the past, consideration has been given to a magnetostrictive layer including an amorphous phase having a stripe-like structure of irradiated portions and unirradiated portions of a high energy density beam arranged alternately and a magnetostrictive layer obtained by surface reformation of a cold paramagnetic steel with the overlap of the beam-treated lines made less than half the width. In these cases, however, there were problems of a low strength of the magnetostrictive layer and a low sensor sensitivity.

SUMMARY OF THE INVENTION

Accordingly, the objects of the present invention are to eliminate the above-mentioned disadvantages of the prior art and to provide a method of formation of a magnetostrictive layer wherein an amorphous magnetostrictive layer is formed on the surface of a detected member using the melting and rapid quenching effect of irradiation by a high energy density beam, in which method the magnetostrictive layer is given a superior soft magnetism and magnetostrictive characteristics and also magnetic anisotropy and the magnetostrictive layer has a high strength, and the provision of a sensitive strain sensor using that magnetostrictive layer.

Other objects and advantages of the present invention will be apparent from the following description.

In accordance with the present invention, there is provided a method of formation of a magnetostrictive layer formed on the surface of a detected member to detect strain comprising:

forming an alloy layer on the surface of said detected member, and, then, scanning a high energy density beam overlappingly on the alloy layer so as to form a magnetostrictive layer induced magnetic anisotropy.

In accordance with the present invention, there is also provided a strain sensor comprising a means for detection which detects magnetic changes in a scanning direction obtained by a method of formation of a magnetostrictive layer on a surface of a detected member to detect strain, wherein an alloy layer is formed on the surface of the detected member, then a high energy density beam is scanned overlappingly on the alloy layer, thereby giving magnetic anisotropy and forming a magnetostrictive layer, and making the scanning direction the same as the direction of stress desired to be detected on the surface of the detected member.

BRIEF DESCRIPTION OF THE DRAWINGS

The present invention will be better understood from the description set forth below with reference to the accompanying drawings; wherein.

DESCRIPTION OF THE PREFERRED EMBODIMENTS

As a first aspect of the invention, the present inventors engaged in numerous experiments to solve the above problem. In the experiments, they irradiated a high energy density beam on an alloy having a composition exhibiting a high glass-forming ability and superior soft magnetic characteristics when an amorphous structure was made by melting and rapid quenching.

As a result, they discovered that a remarkable magnetic anisotropy is manifested by overlappingly irradiating a beam, not by the conventional method, that is, the method of partially irradiating a beam in stripes leaving unirradiated portions.

Figure 1:
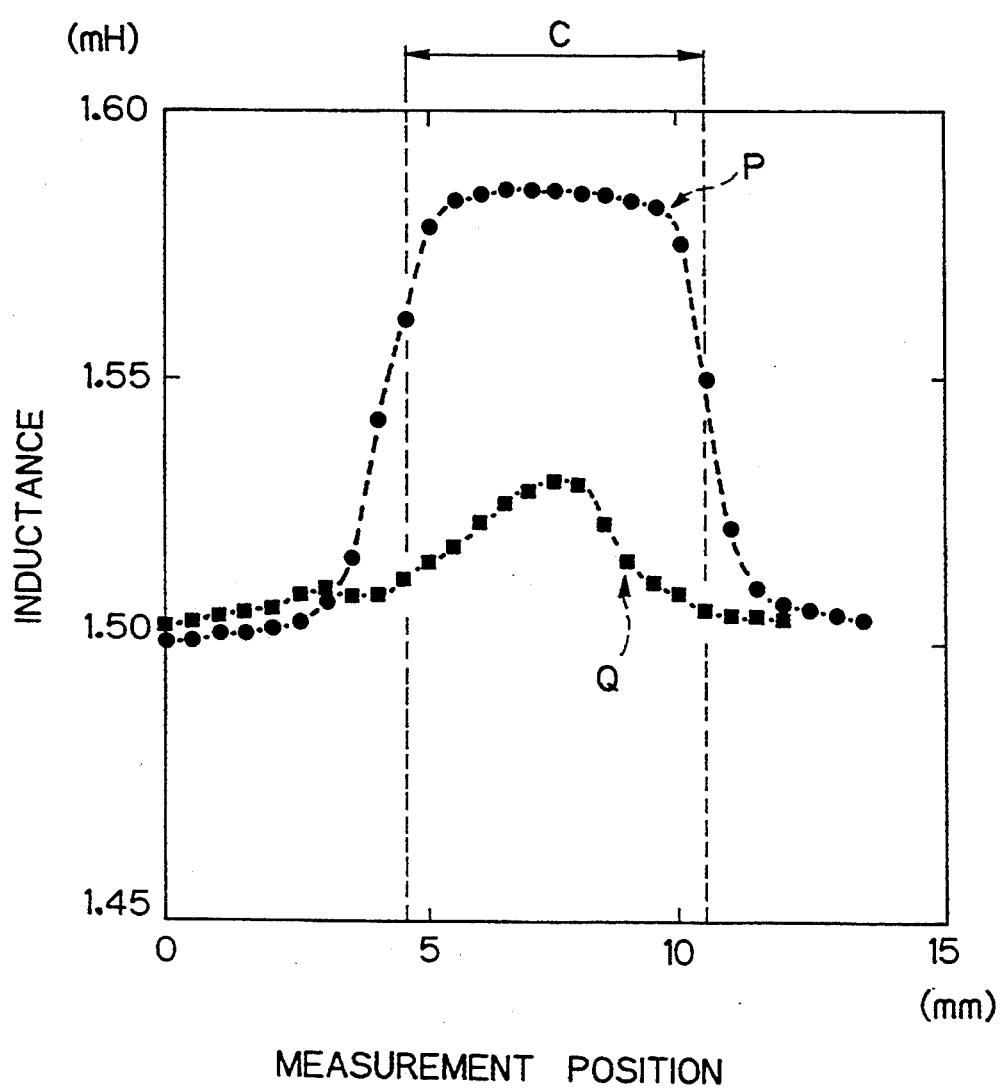
FIG. 1 shows the results of measurement of inductance of an amorphous alloy layer made by overlapping irradiation of a laser beam of a first aspect of the invention.

As an example of this, FIG. 1 shows the results of measurement of the inductance of a sample comprised of an $Fe_{78}B_{13}Si_9$ alloy layer brazed on a stainless steel (SUS304) sheet on which is formed an alloy layer made amorphous by overlapping irradiation of a continuous $CO_2$ laser beam. Here, C shows the alloy layer portion made amorphous by continuous laser irradiation, P shows the inductance in the direction parallel to the laser scanning direction, and Q shows the direction perpendicular to the laser scanning direction.

The inductance measured in the direction parallel to the laser scanning direction became clearly higher than the inductance measured in the direction perpendicular to the laser scanning direction.

In this way, a remarkable magnetic anisotropy where the beam scanning direction becomes the easy magnetization direction appears at the amorphous alloy layer prepared by the overlapping irradiation of the high energy density beam. The reason for this is believed to be the effect of the residual stress and structure caused during the melting and rapid quenching by the beam irradiation.

Using the magnetic anisotropy of the amorphous alloy layer caused by the overlapping irradiation of the high energy density beam of the present invention, it is possible to mainly detect just the stress and strain in the desired direction of the surface of the detected member by aligning the beam scanning direction, which becomes the easy magnetization direction, with the direction of stress and strain desired to be detected at the surface of the detected member.

For example, if an amorphous magnetostrictive layer is formed by overlapping irradiation of a beam on a shaft surface in a direction 45° with respect to the center axis, it is possible to detect the maximum stress and maximum strain of the shaft surface caused by the torque.

Further, by making the high energy density beam overlap on an alloy layer formed on the surface of said detected member so as to form crystallized heat affected zones along the interface between the portions already melt-quenched to amorphous by a first beam irradiation and the melted portions caused by an adjoining second beam irradiation, one may form an amorphous magnetostrictive layer induced with shape magnetic anisotropy.

Still further, as a second aspect of the invention, there is provided a method of formation of a high strength magnetostrictive layer comprised of mainly an amorphous alloy having superior soft magnetism and magnetic anisotropy by controlling the overlapping rate (($(D-d)/D\times 100$ (%))) between adjoining melted and solidified portions caused by the irradiation of high energy density beam to a range of greater than 50% to less than 85%, and a high sensitivity strain sensor using the same.

That is, according to the first aspect of the invention, comparing the magnetostrictive layer comprised of mainly an amorphous phase formed by the overlapping irradiation of the high energy density beam of the present invention and the magnetostrictive layer including an amorphous phase formed by partial irradiation in a stripe manner leaving unirradiated portions, while both have magnetic anistrophy, the former has a greater ratio of the amorphous phase, so the magnetization (amount of magnetic flux in magnetostrictive layer) under a predetermined magnetic field becomes greater and the sensor output (sensitivity) becomes higher.

Further, the latter suffers from cracks and lower fatigue strength due to the remarkable difference in the mechanical properties between the irradiated portions and the unirradiated portions, while the former has a structure more uniform than the latter due to the overlapping and therefore a higher strength of the magnetostrictive layer.

Regarding the bonding between the magnetostrictive layer and the detected member, if use is made of the method of metal bonding such as brazing or flame spraying in the process of forming the alloy layer with the high glass-forming ability on the surface of the detected member before the overlapping irradiation of the high energy density beam, a bonding strength higher than the method of adhering an amorphous alloy ribbon by a resin can be obtained and the reliability is sufficient. Further, if use is not made of the hot isostatic press (HIP) etc., the production costs will not rise.

Also, by overlapping irradiation of a high energy density beam so as to form crystallized heat affected zones with a thin thickness in the amorphous layer, it is possible to prepare a magnetostrictive layer of a structure with a soft magnetic amorphous alloy phase partitioned into narrow strips.

The magnetostrictive layer of the present invention not only has shape magnetic anisotropy, but also can have the amorphous phase portion made in narrower shapes compared with the past, so it is possible to impart a greater shape magnetic anisotropy. Further, it is possible to make the ratio of volume of the amorphous phase portion in the magnetostrictive layer greater.

Therefore, it is possible to obtain a higher sensitivity when using the magnetostrictive layer for a magnetostrictive sensor like a noncontact torque sensor.

Next, the operation of the second aspect of the invention will be explained.

In the second aspect of the invention, the rate of the overlap between adjoining melted and solidified portions (overlapping rate) when making a surface layer melted and rapid quenched by irradiation of a high energy density beam is expressed by $$(D-d)/D \times 100\%$$

when the width of the melted and solidified portion caused by a single beam scan is D and the beam scanning pitch is d.

When a magnetostrictive layer including an amorphous phase prepared by irradiation of a high energy density beam is used for a torque sensor or other stress-strain sensor, the magnetic permeability, the magnetostriction, the magnetic anisotropy, and other magnetic properties were important keys along with the strength of the layer and other mechanical properties.

These properties are greatly affected by the overlapping rate (($(D-d)/D\times 100\%$) between adjoining melted and solidified portions when irradiating by high energy density beam scanning. When the overlapping rate between adjoining melted and solidified portions is made in a range greater than 50% to less than 85%, characteristics particularly desirable as a sensor can be obtained. The reason is believed to be the effect of the residual stress or the structure caused when melting, rapidly quenching, and solidifying at the time of overlapping irradiation of the beam.

The mainly amorphous alloy layer formed by controlling the overlapping rate between the adjoining melted and solidified portions in the range of greater than 50% and less than 85% at the time of overlapping irradiation of the high energy density beam in the present invention manifests a remarkable magnetic anisotropy where the beam scanning direction becomes the easy magnetization direction. Accordingly, if the beam scanning direction (the easy magnetization direction) is parallel to the direction of stress and strain desired to be detected on the surface of the detected member, it is possible to detect with a high sensitivity just the stress and strain in the desired direction of the surface of the detected member.

For example, if a shaft surface is subjected to overlapping irradiation of the beam of the present invention in a direction 45° with respect to the center axis to form an amorphous alloy magnetostrictive layer there, it is possible to detect with a high sensitivity the maximum stress and the maximum strain of the shaft surface caused by the torque.

Still further, comparing the mainly amorphous magnetostrictive layer formed by the overlapping irradiation of the high energy density beam of the second aspect of the invention while controlling the overlapping rate between melted and solidified portions caused by the high energy density beam irradiation and the magnetostrictive layer including an amorphous phase formed by partial irradiation leaving unirradiated portions in a stripe manner, while both have magnetic anisotropy, the former has a greater ratio of volume of the amorphous alloy phase with superior soft magnetism compared with the latter and is prepared by the melting and rapid cooling, so the sensitivity in the case of making a sensor becomes higher. Further, the latter suffers from cracks and lower fatigue strength due to the remarkable difference in the mechanical properties between the melt-quenched portions and the unmelted portions, while the former has a structure more uniform than the latter, so the strength of the former becomes higher. That is, rather than increasing the beam scanning pitch to irradiate leaving unmelted portions between adjoining melt-quenched portions, more desirable properties, both magnetic and mechanical, may be obtained for the stress-strain sensor when overlappingly irradiating controlling the overlapping rate between adjoining melted and solidified portions.

In this way, according to the present invention, by overlapping irradiation of a high energy density beam and controlling the overlapping rate $((D-d)/D \times 100\%)$ between the adjoining melted and solidified portions at that time to a range greater than 50% and less than 85%, it is possible to form on the surface of the detected member a magnetostrictive layer comprised mainly of a high strength amorphous phase superior in magnetic properties such as magnetic permeability and magnetic anisotropy. Further, by using this, it is possible to produce a particularly high sensitive stress-strain sensor such as a magnetostrictive torque sensor.

As mentioned in detail above, according to the first aspect of the invention, by overlapping irradiation of a high energy density beam, it is possible to form a high strength magnetostrictive layer comprised mainly of an amorphous alloy which has superior soft magnetic characteristics and magnetic anisotropy at the surface of the detected member. Further, by using this, it is possible to provide a strain sensor having a wide dynamic range which enables high sensitivity detection of stress-strain in any direction of the surface of the detected member without contact.

Further, by the overlapping irradiation of the high energy density beam so as to form heat affected zones, it is possible to form a structure with the amorphous phase partitioned narrowly and thereby impart a great shape magnetic anisotropy to the magnetostrictive layer.

Further, according to the second aspect of the invention, it is possible to form on the surface of a detected member a magnetostrictive layer comprised of mainly an amorphous phase which is superior in magnetic permeability, magnetic anisotropy, and other magnetic properties and is high strength when controlled the overlapping rate $((D-d)/D \times 100 \, (\%))$ between adjoining melted and solidified portions caused by the beam scanning at that time to a range of greater than 50% and less than 85%. Further, by using this, it is possible to provide a particularly high sensitive stress-strain sensor such as a magnetostrictive torque sensor.

EXAMPLES

The present invention will now be further illustrated by, but is by no means limited to, the following Examples.

Example 1

The first aspect of the invention will be discussed below.

As shown in FIG. 2, an $Fe_{78}B_{13}Si_9$ alloy ribbon is bonded through silver brazing to the surface of a shaft 1 (diameter 20 mm) made of stainless steel (SUS304) by heating at 810° C. By this, a strong metal bonded $Fe_{78}B_{13}Si_9$ alloy layer $2a$ is formed on the shaft surface. The surface of this $Fe_{78}B_{13}Si_9$ alloy layer $2a$ is subjected to overlapping irradiation of a continuous $CO_2$ laser beam 3 in the scanning direction $3a$ of the arrow mark to cause melt-quenching and the formation of an amorphous phase. The conditions of laser irradiation at this time are blowing Ar gas, an output of 650 W, a defocus distance of 1.5 mm, and a beam scanning speed of 2 m/sec. The beam scanning direction was made a direction forming an angle of 45° with respect to the center axis of the shaft and the beam irradiation pitch was made a distance between centers of beams d of 50 μm, for causing overlapping irradiation. Note that in the case of these conditions, the width D of the melt-quenched portion caused by a single scanning of the beam 3 was 130 μm, so the distance $(D-d)$ of the overlapping portion was 80 μm.

Figure 3:
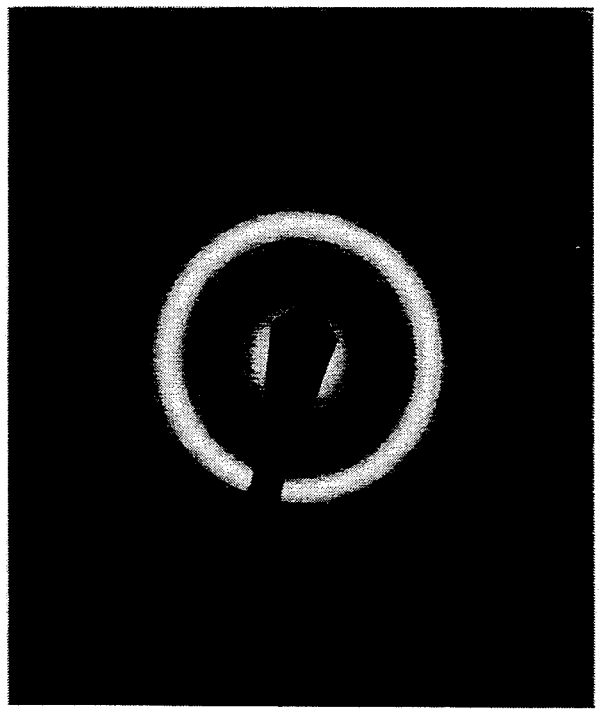
FIG. 3 is a photograph showing the metal structure as an electron beam diffraction pattern of a laser irradiated layer of a first aspect of the invention.

FIG. 3 shows the electron beam diffraction pattern of the magnetostrictive layer 2—the laser irradiated portion formed on the shaft surface. According to the electron beam diffraction pattern, most of the laser irradiated portion became amorphous in state.

Figure 2A:
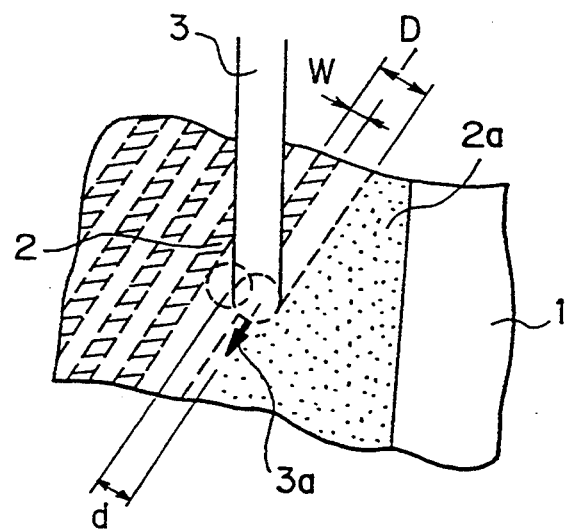
FIG. 2(a) is a schematic view of a method of formation of an amorphous alloy layer by overlapping irradiation of a laser beam of a first aspect of the invention.
Figure 2B:
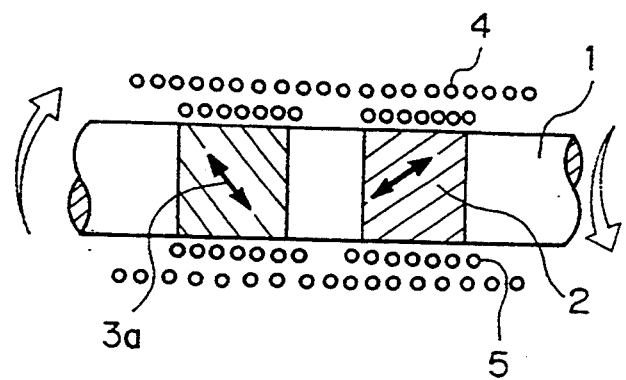
FIG. 2(b) is a schematic view of a noncontact magnetostrictive type torque sensor according to the present invention.
Figure 4:
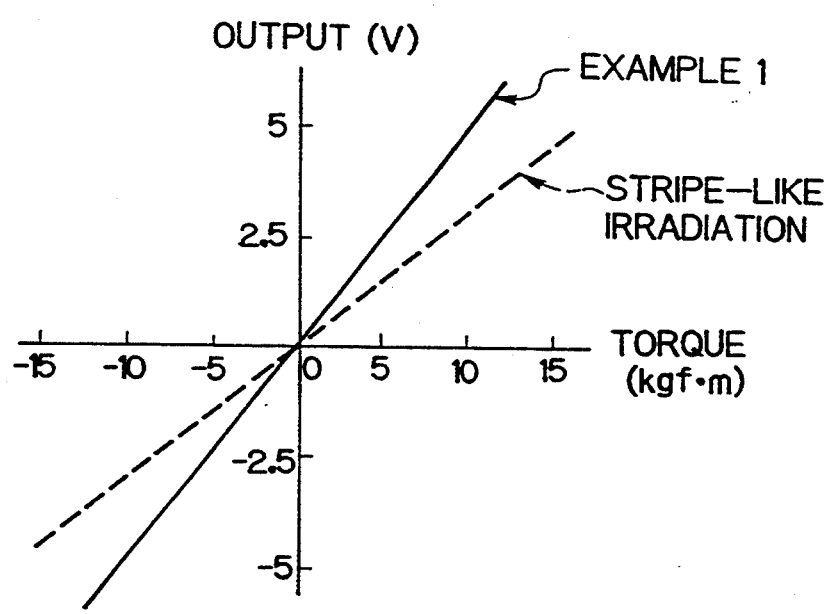
FIG. 4 shows the output characteristics of a noncontact magnetostrictive type torque sensor according to the first aspect of the present invention.

FIG. 2(b) is a schematic view showing the construction of a noncontact type torque sensor using the shaft prepared by the above method, wherein 4 shows an exciting coil and 5 a detecting coil. The results of the measurement are shown in FIG. 4. Further, in FIG. 4, there are also shown the characteristics in the case of use of a shaft on which is formed a layer with unmelted unirradiated portions left in a stripe manner in widths of 0.1 mm ($d-D=0.1$ mm) by using the same method as above, keeping the same irradiation conditions except for the beam scanning pitch, i.e., increasing only the beam scanning pitch.

From this figure, it is seen that in the case of use of the shaft having the layer formed by overlapping irradiation of the laser beam 3, the sensor output (sensitivity) becomes clearly higher than the case of use of a shaft having a layer leaving unirradiated portions without use of overlapping irradiation.

The transmission of strain from the stainless steel shaft 1 to the magnetostrictive layer 2 at the time of torque action was measured by attaching strain gauges to the surfaces of both the magnetostrictive layer and the stainless steel shaft 1, whereupon it was found that even with action of a torque of 200 N.m, the strains at the surface of the laser irradiated layer and the surface of the stainless steel completely matched, and a good bond was obtained.

Example 2

Figure 5:
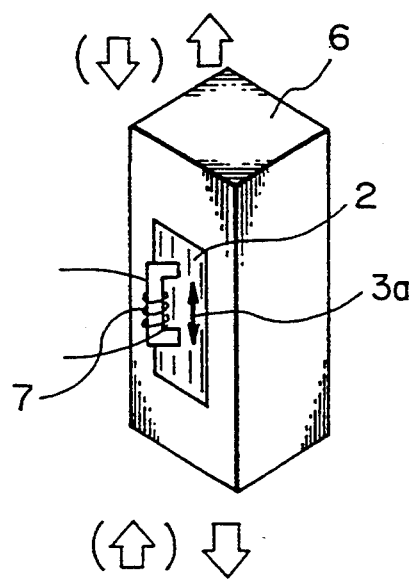
FIG. 5 is a schematic view of a method of detection of tensile and compressive strain according to the first aspect of the present invention.

As shown in FIG. 5, a continuous $CO_2$ laser beam was overlappingly irradiated on an $Fe_{78}B_{13}Si_9$ alloy layer by the same preparation method and preparation conditions as in Example 1 to form an amorphous alloy layer 2 of a size of 8 mm × 30 mm on the longitudinal surface of a square columnar shaped stainless steel (SUS304) material 6 of a size of 10 mm × 10 mm × 40 mm. Note that the beam scanning direction $3a$ was made the longitudinal direction of the stainless steel material. For a comparison with this, a sample was prepared in the same way as in Example 1 forming on the surface of a stainless steel material of the same shape a layer beam irradiated in the longitudinal direction leaving 0.1 mm unirradiated portions (portions not melted) in a stripe manner.

These samples were placed in an Instron type testing machine and subjected to a tensile or compressive load in the longitudinal direction so as to generate elastic strain at the magnetostrictive layer 2. This elastic strain was detected by the method shown in FIG. 5, based on the magnetostrictive effect, with a magnetic sensing portion 7 placed in a noncontact manner.

Figure 6:
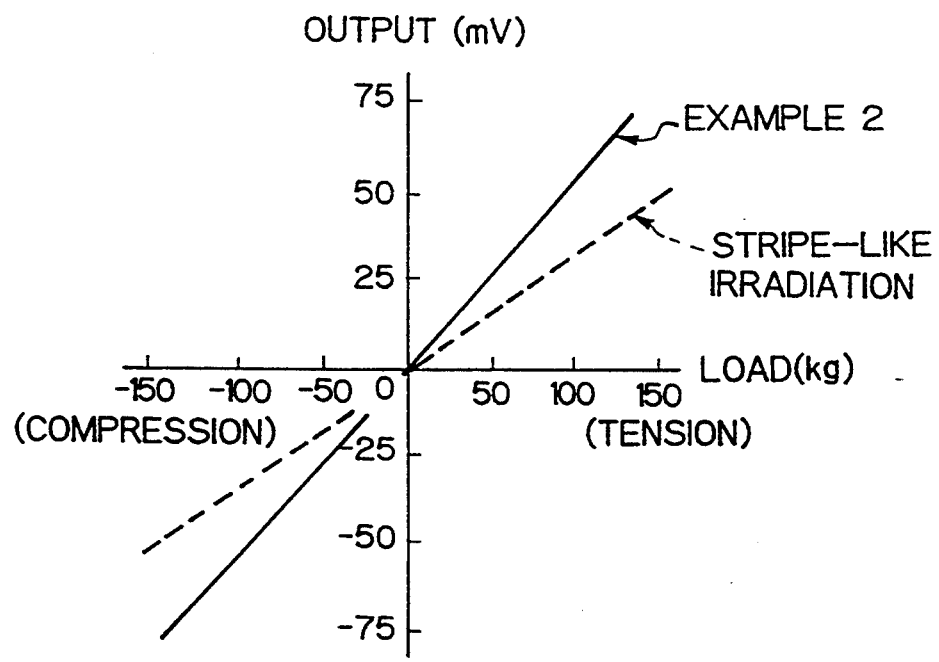
FIG. 6 shows the detection characteristics of tensile and compressive strain according to the first aspect of the present invention.

The output characteristics obtained as a result are shown in FIG. 6.

According to this, in the same way as in Example 1, the sample irradiated the laser beam overlappingly had a higher output (sensitivity) compared with the sample with unirradiated portions left in a stripe manner.

The two types of samples were placed in an Instron type testing machine and alternately subjected to a tensile and compressive load (fatigue stress) in the longitudinal direction to give a strain of 0.15%. As a result, the sample with portions unirradiated by the laser and left in stripes suffered from cracks parallel to the beam scanning direction in the layer surface, when the tensile and compressive stress cycle was repeated about $1.5 \times 10^5$ times. As opposed to this, the sample with overlapping irradiation of the laser beam did not experience cracks in the layer surface even when the stress cycle was repeated about $5 \times 10^6$ times, and no cracks were also observed in the bonded portions with the stainless steel when the cross-section was observed by an optical microscope.

Example 3

Figure 7:
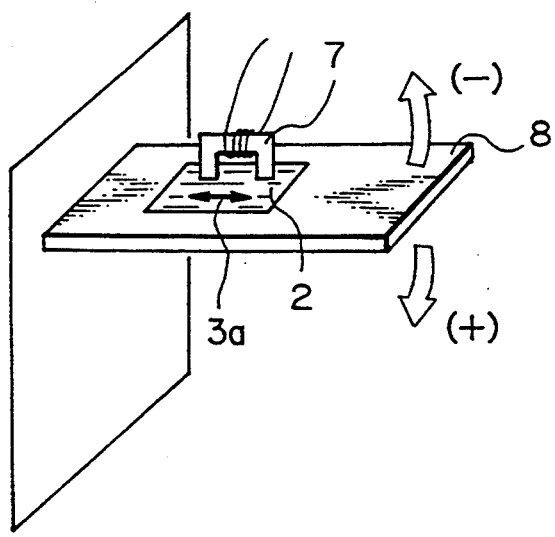
FIG. 7 is a schematic view of a method of detection of bending strain according to the first aspect of the present invention.

As shown in FIG. 7, an amorphous alloy layer 2 of $Fe_{78}B_{13}Si_9$ of a width of 15 mm and a length of 30 mm was prepared by bonding using silver brazing on the surface of a stainless steel sheet of a width of 30 mm × a length of 100 mm × a thickness of 3 mm, and by overlapping irradiation of a laser beam by the same method and preparation conditions as in Example 1. The beam scanning direction 3a was made the longitudinal direction of the stainless steel sheet.

One end of the stainless steel sheet with the amorphous alloy magnetostrictive layer formed on its surface was affixed as shown in FIG. 7. A load was made to act on the other end to cause elastic bending deformation. At this time, a magnetic sensing portion 7 was disposed facing the magnetostrictive layer and the bending strain in the longitudinal direction of the stainless steel sheet was detected by the noncontact manner.

Figure 8:
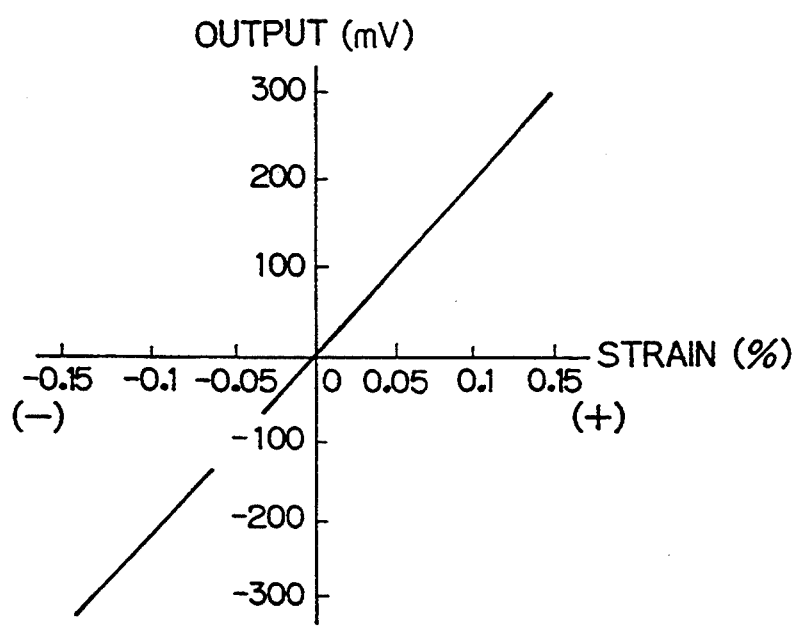
FIG. 8 shows the detection characteristics of bending strain according to the first aspect of the present invention.

The results thus obtained are shown in FIG. 8. Both a tensile stress and compressive stress were applied to the magnetostrictive layer by changing the direction of load, but high sensitivity characteristics could be obtained in all cases. Further, no cracking or peeling occurred in the magnetostrictive layer.

Example 4

Figure 9:
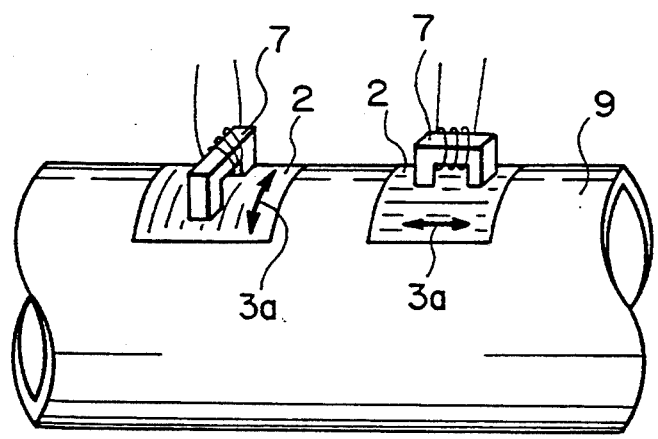
FIG. 9 is a schematic view of a method of detection of strain on a cylindrical surface upon which inside pressure acts according to the first aspect of the present invention.

As shown in FIG. 9, an amorphous alloy magnetostrictive layer 2 of a size of 20 mm × 20 mm was formed at two locations on the outer surface of a stainless steel cylinder 9 of an inside diameter of 150 mm and a thickness of 2 mm by overlapping irradiation of a laser beam. The preparation method and preparation conditions were the same as those shown in Example 1. The scanning direction 3a of the laser beam was made the circumferential direction for one layer and the longitudinal direction for the other layer. Magnetic sensing portions 7 were disposed facing these magnetostrictive layers. An inside pressure of 100 kg/cm² was applied to the stainless steel cylinder and the strains in the circumferential direction and the longitudinal direction caused along with this were detected by the magnetostrictive effects of the layers. Here, the strain in the circumferential direction was detected by the magnetostrictive layer formed by scanning the laser beam in the circumferential direction, while the strain in the longitudinal direction was detected by the magnetostrictive layer formed by scanning in the longitudinal direction.

Figure 10:
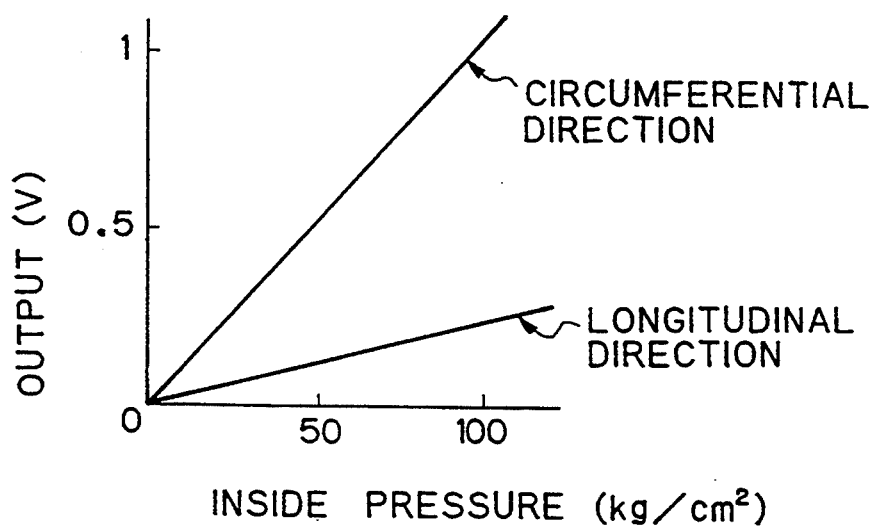
FIG. 10 shows the detection characteristics of the strain of the cylindrical surface caused by the inside pressure according to the first aspect of the present invention.

FIG. 10 shows the resultant output characteristics. The output of the layer formed by scanning the beam in the circumferential direction became higher than that of the layer formed by scanning in the longitudinal direction. It was learned that only the stress-strains in the beam scanning directions were detected for the respective magnetostrictive layers. Further, even if inside pressure was applied, no cracking or peeling occurred in the magnetostrictive layer comprised of mainly the amorphous alloy prepared by overlapping irradiation of the laser beam.

Example 5

In Example 5, as shown in FIG. 2(a) (Example 1), an alloy ribbon of $Fe_{78}B_{13}Si_9$ was bonded via silver brazing on a shaft 1 (diameter of 20 mm) made of stainless steel by heating at 810° C. By this, an $Fe_{78}B_{13}Si_9$ alloy layer 2a was formed with a strongly metallic bonding to the surface of the shaft. A continuous $CO_2$ beam 3 was overlappingly irradiated on the surface of this $Fe_{78}B_{13}Si_9$ alloy layer 2a in the scanning direction 3a of the arrow mark to melt and rapidly quench the same, thereby making the $Fe_{78}B_{13}Si_9$ alloy layer 2a amorphous and forming the magnetostrictive layer 2.

The laser irradiation conditions in Example 5 at this time were blowing of Ar gas, an output of 750 W, a defocus distance of 1.5 mm, and a beam scanning speed of 2 m/sec. The beam scanning direction 3a was made a direction forming an angle of 45° with respect to the center axis of the shaft. The beam irradiation pitch, that is, a distance between centers of beams (d) was 50 µm. Note that in the case of these conditions, the width D of the melted portion caused by a single scanning of the beam 3 was 130 µm.

Figure 11A:
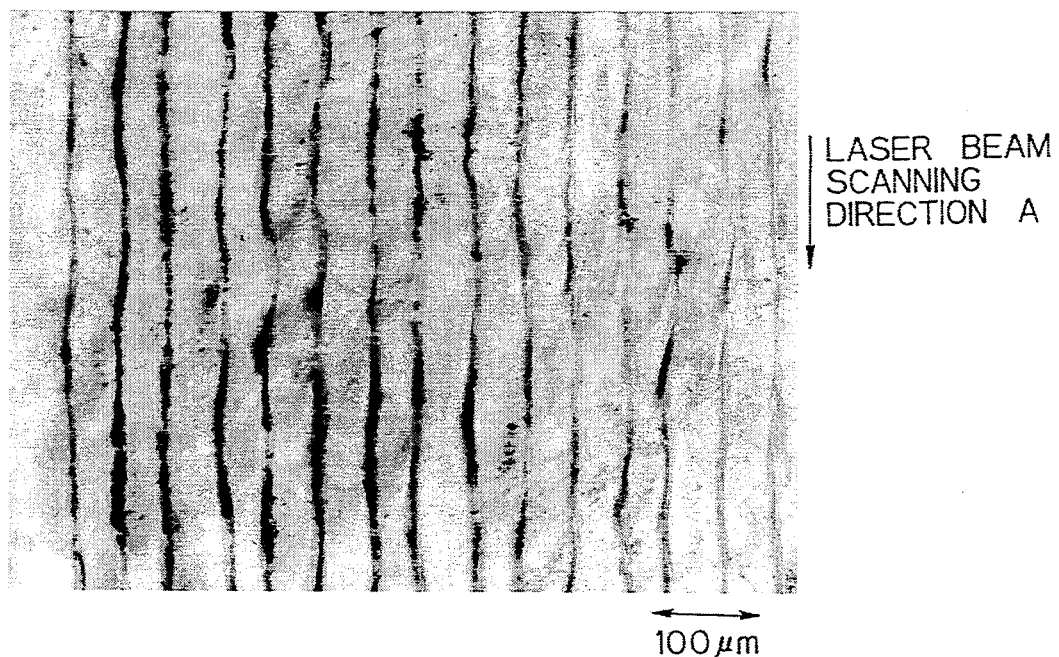
FIGS. 11(a) and (b) are photographs showing the metal structure of the surface and cross-section of the magnetostrictive layer of Example 5.

FIGS. 11(a) and (b) show optical microscopic photographs of the surface and cross-section of the magnetostrictive layer 2 formed by the laser irradiation of the surface of the shaft (cross-section is etched by nital solution).

Figure 11B:
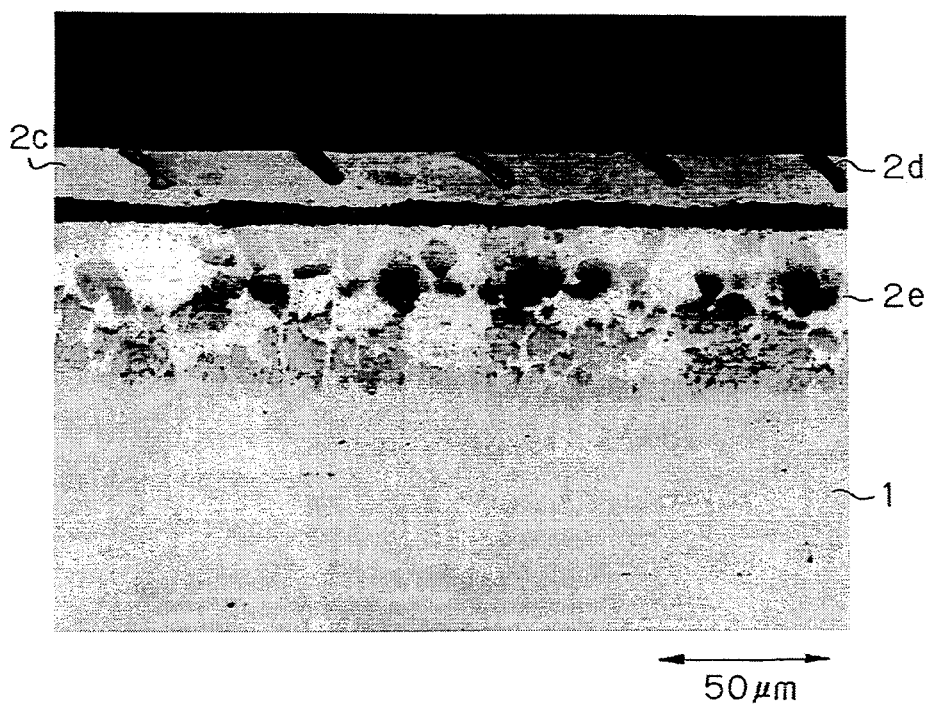

As shown in FIG. 11(a), the surface of the magnetostrictive layer 2 is observed to have a pattern along the beam scanning direction in accordance with the overlapping irradiation of the beam 3. Further, as shown in FIG. 11(b), in the cross-section perpendicular to the beam scanning direction, among the portions melt-quenched by the irradiation of the beam 3, the portion occupying the major portion, appearing white and not etched, is the amorphous phase 2c. The portions etched black and present at intervals so as to partition the same are heat affected zones 2d including the crystal phase.

The heat affected zones 2d appear near the interfaces between the adjoining melted and solidified portions caused by the overlapping scanning of the beam 3. The reasons for their production are the heat effect at the amorphous portions melt-quenched by the prior (first) beam scanning from the adjoining melted portions produced by the next (second) beam scanning and the crystallization causes along the interface of the same.

The thickness of the heat affected zones 2 thus produced is small (in this case about 4 µm). They are present continuously along the scanning direction of the laser beam and partition the amorphous phase 2c extremely narrowly (in this case, a width of about 50 µm). Further, the areas 2e and 1 seen in the cross-section photograph show the brazing material layer and the stainless steel shaft.

Figure 12:
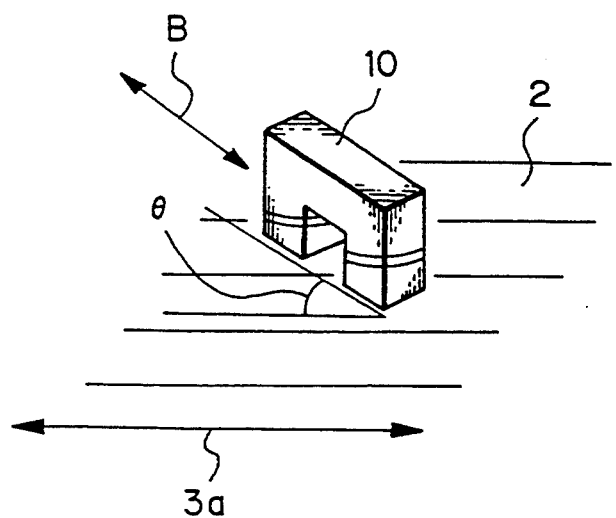
FIG. 12 is an explanatory view showing a method of measuring the inductance when changing the magnetization direction and beam scanning direction of the magnetostrictive layer of Example 5.
Figure 13:
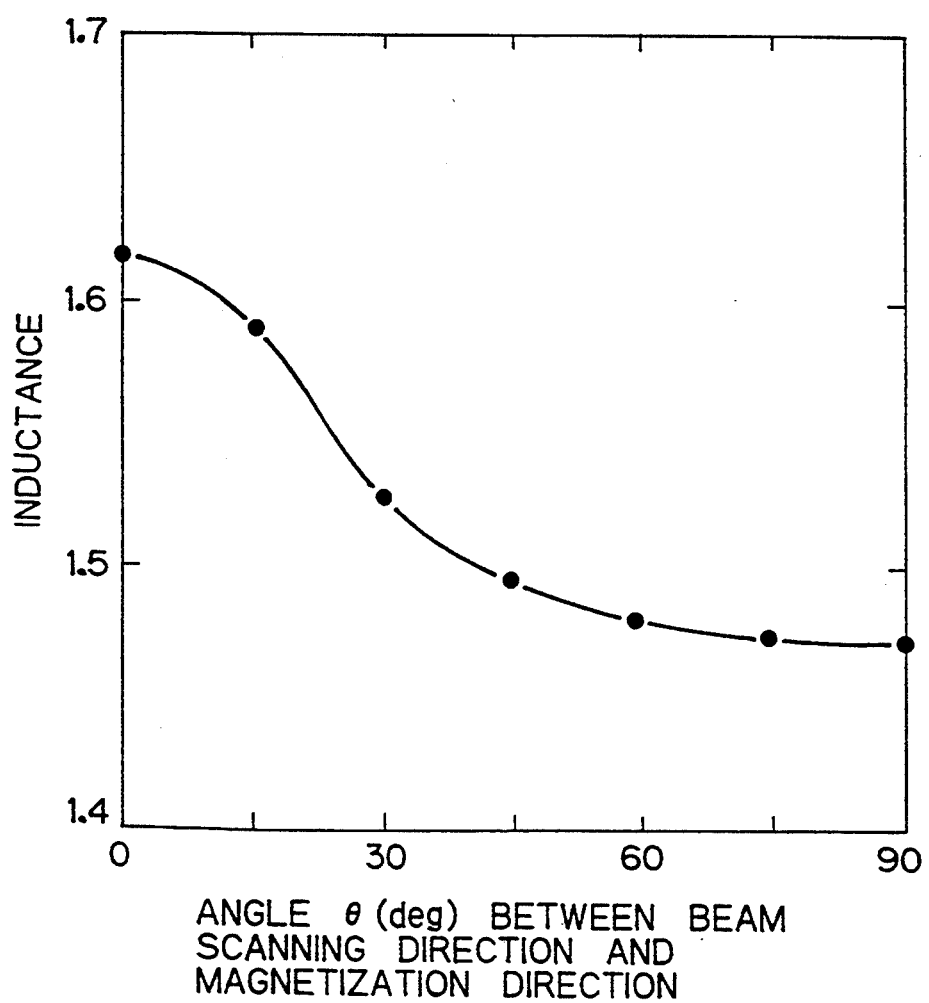
FIG. 13 is a characteristic diagram showing the correlation between the inductance and the angled formed between the magnetization direction and beam scanning direction of the magnetostrictive layer of Example 5.

FIG. 12 schematically shows a method of measuring the inductance by applying a magnetic field using a magnetic head 10 in various directions in the plane of a magnetostrictive layer 2 having such a structure. The angle between the scanning direction 3a of the beam 3 and the magnetization direction B is shown by $\theta$. The relationship between the $\theta$ in the magnetostrictive layer 2 and the inductance is shown in FIG. 13.

According to these results, the inductance in the scanning direction 3a becomes remarkably higher compared with the direction perpendicular to the same, so it is learned that the magnetostrictive layer 2 has magnetic anisotropy where the beam scanning direction 3a becomes the easy magnetization direction. The cause of this magnetic anisotropy is that the crystallized heat affected zones 2d where the soft magnetic characteristics become inferior to those of the amorphous phase 2c exist along the beam scanning direction, so the demagnetization becomes larger in the direction perpendicular to the beam scanning direction 3a, while the amorphous alloy phase 2c with the superior soft magnetic characteristics is connected narrowly in the direction parallel to the beam scanning direction 3a, so a large shape magnetic anisotropy where the scanning direction becomes the easy magnetization direction appears.

Figure 14A:
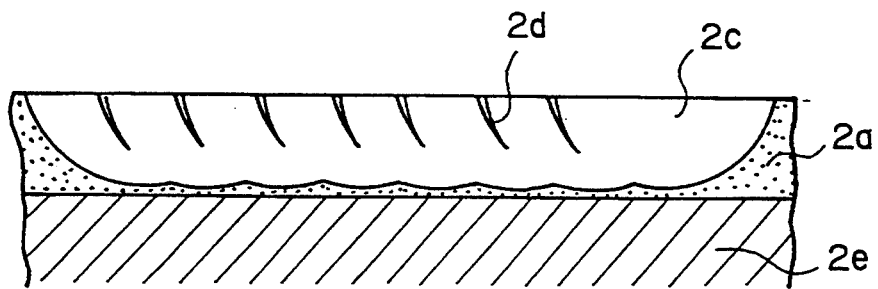
FIGS. 14(a) and (b) are a schematic view of a cross-section of the magnetostrictive layer of Example 5 and a schematic view of a cross-section of a magnetostrictive layer where unirradiated portions are left in a stripe form.
Figure 14B:
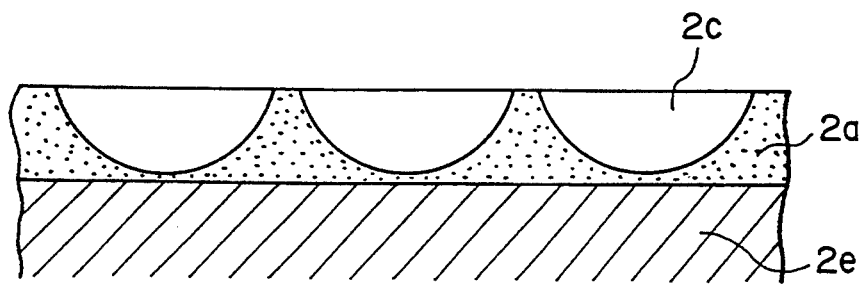

FIG. 14(a) is a schematic view of the above cross-sectional structure prepared by overlapping irradiation of the laser beam 3. FIG. 14(b) is a schematic view of the cross-sectional structure produced in the case of stripe-like irradiation leaving unirradiated portions using a beam scanning pitch of 150 $\mu$m and otherwise the same irradiation conditions.

As is clear from these figures, in the amorphous magnetostrictive layer including the heat affected zones 2d prepared by overlapping irradiation, compared with the amorphous magnetostrictive layer prepared by stripe-like irradiation, both are portions including crystal phases with the amorphous phase portion 2c partitioned up in structure, but the former has a smaller width of the partitioned amorphous phase portions 2c (the amorphous phase portions 2c are narrower) and the sectional area and the volume of the amorphous phase portion 2c, which accounts for all of the magnetostrictive layer 2, become larger.

The same measurement was performed as in Example 2, as shown in FIG. 2(b), on the torque sensor having a magnetostrictive layer 2 obtained by Example 5.

Figure 15:
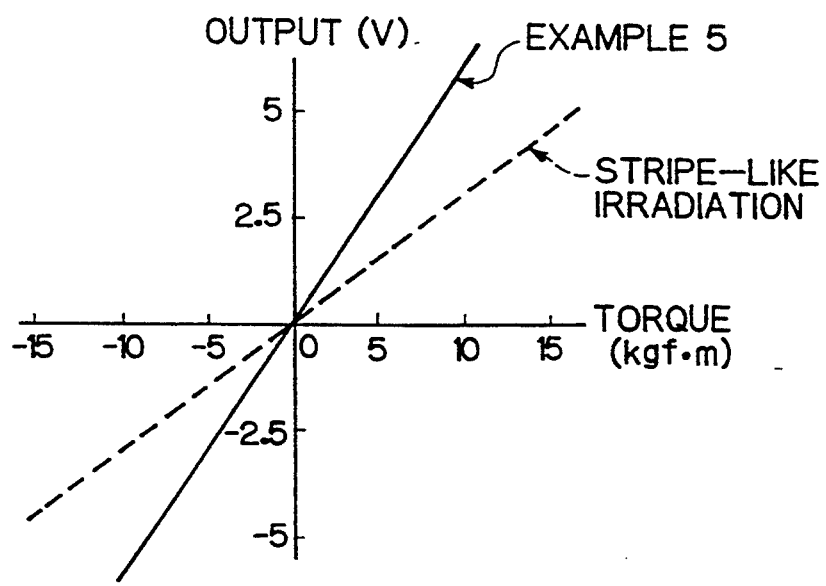
FIG. 15 shows the output characteristics of the noncontact magnetostrictive type torque sensor according to Example 5.

The results of the measurement are shown in FIG. 15. In the figure, there are shown the case of a shaft formed with a magnetostrictive layer 2 (beam scanning pitch of 50 $\mu$m) shown in FIG. 14(a) of Example 5 and the case of a shaft formed with a magnetostrictive layer (beam scanning pitch of 150 $\mu$m) by stripe-like irradiation shown in FIG. 14(b). It is clear that the former has a higher sensor sensitivity.

This is because as mentioned earlier the former is partitioned by the heat affected zones 2d, so the width of the amorphous phase 2c becomes smaller and the shape magnetic anisotropy becomes larger, and the sectional area and volume of the amorphous phase 2c occupying the overall magnetostrictive layer become larger.

Still further, in Example 5, as clear from FIG. 15, by performing overlapping irradiation to form the heat affected zones, it is possible to obtain a better sensor sensitivity compared with even the magnetostrictive layer formed by the overlapping irradiation not forming heat affected zones as in Example 1.

Also, the transmission of strain from the stainless steel shaft 1 to the magnetostrictive layer 2 at the time of torque action was measured by attaching strain gauges to the surfaces of both the magnetostrictive layer and the stainless steel shaft 1, whereupon it was found that even with action of a torque of 200 N.m, the strains at the surface of the laser irradiated layer and the surface of the stainless steel completely matched and a good bonding was obtained.

Example 6

A continuous $CO_2$ laser beam was overlappingly irradiated on an $Fe_{78}B_{13}Si_9$ alloy layer by the same preparation method and preparation conditions as in Example 5 to form a magnetostrictive layer of a size of 8 mm $\times$ 30 mm including crystallized heat affected zones in the amorphous phase on the longitudinal surface of a square columnar shaped stainless steel (SUS304) material of a size of 10 mm $\times$ 10 mm $\times$ 40 mm the same as in Example 2. Note that the beam scanning direction 3a was made the longitudinal direction of the stainless steel material.

For comparison with this, a sample was prepared having a magnetostrictive layer including an amorphous phase formed by irradiating a beam with a beam scanning pitch of 150 $\mu$m leaving in a stripe manner unmelted portions comprised of a crystal phase on a stainless steel surface of the same shape.

Figure 16:
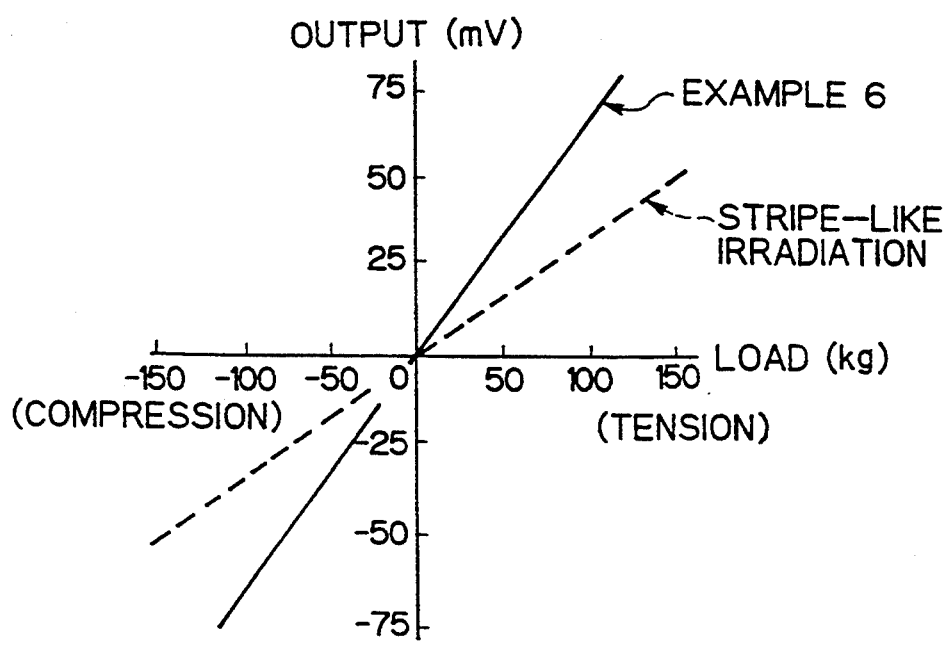
FIG. 16 shows the detection characteristics of tensile and compressive strain according to Example 5.

These samples were placed in an Instron type testing machine and subjected to a tensile or compressive load in the longitudinal direction so as to generate elastic strain at the magnetostrictive layer. This was detected using the magnetostrictive effect by the method shown in FIG. 5 with a magnetic sensing portion 9 placed in a noncontact manner. FIG. 16 shows the output characteristics obtained as a result.

According to this, in the same way as in Example 5, the sample having the amorphous magnetostrictive layer including the heat affected zones prepared by overlapping irradiation of the laser beam had an higher output (sensitivity) compared with that having the layer including amorphous phases leaving unirradiated portions in a stripe manner.

The former was placed in an Instron type testing machine and alternately subjected to a tensile and compressive load in the longitudinal direction to give a strain of $\pm 0.15\%$ and the fatigue test was conducted. As a result, no cracks occurred in the layer surface even when the stress cycle was repeated $5 \times 10^6$ times. No cracks were observed in the bonded portions with the stainless steel even when the cross-section was observed by an optical microscope. In the above examples, use was made of laser beams in all cases as the high energy density beams, but electron beams and other beams may be similarly used.

Example 7

Next, a second aspect of the present invention will be explained.

Figure 17:
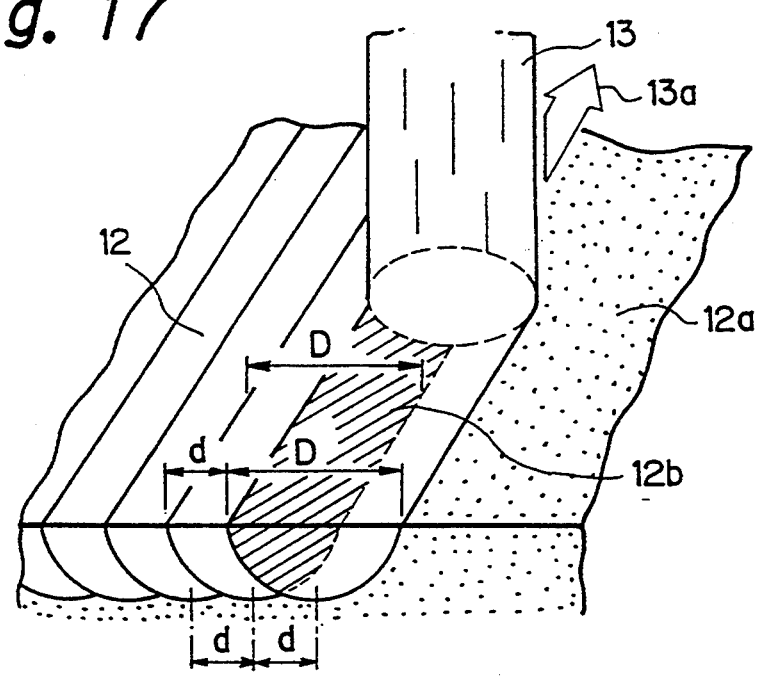
FIG. 17 is a schematic view of a method of formation of an amorphous alloy magnetostrictive layer produced by irradiation of a laser beam in a second aspect of the invention.

In the second aspect of the invention, an $Fe_{78}B_{13}Si_9$ alloy ribbon is bonded by heating at 810° C. through silver brazing to the surface of a shaft 11 (diameter of 20 mm) made of stainless steel (SUS304). By this, an $Fe_{78}B_{13}Si_9$ alloy layer 12a strongly metal bonded to the surface of the shaft 11 is formed. A continuous $CO_2$ laser beam 13 was irradiated on the surface of this $Fe_{78}B_{13}Si_9$ alloy layer 12a as shown in FIG. 17 along the scanning direction 13a of the arrow mark to melt-quench the same and thereby try to prepare a magnetostrictive layer 12 comprised mainly of an amorphous phase. The conditions of the laser irradiation were blowing of Ar gas, an output of 650 W, a defocus distance of 1.5 mm, and a beam scanning speed of 200 cm/sec. The beam irradiation direction was made the direction forming an angle of 45° with respect to the center axis of the shaft. In the case of these irradiation conditions, the width D of the melted and solidified portions caused by a single beam scan was 0.13 mm, and the beam scanning pitch d was changed in the range of 0.01 mm to 0.2 mm, whereby various shafts were prepared having changed overlapping rates between adjoining melted and solidified portions ((width of overlap portion 12b)/D×100% (0.13 mm−d)/0.13 mm×100%). The effects of the overlapping rate were investigated in the following way.

Figure 18:
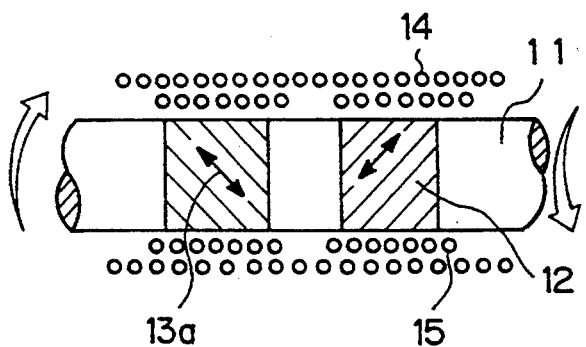
FIG. 18 is a schematic view of a noncontact magnetostrictive type torque sensor according to the second aspect of the present invention.
Figure 19:
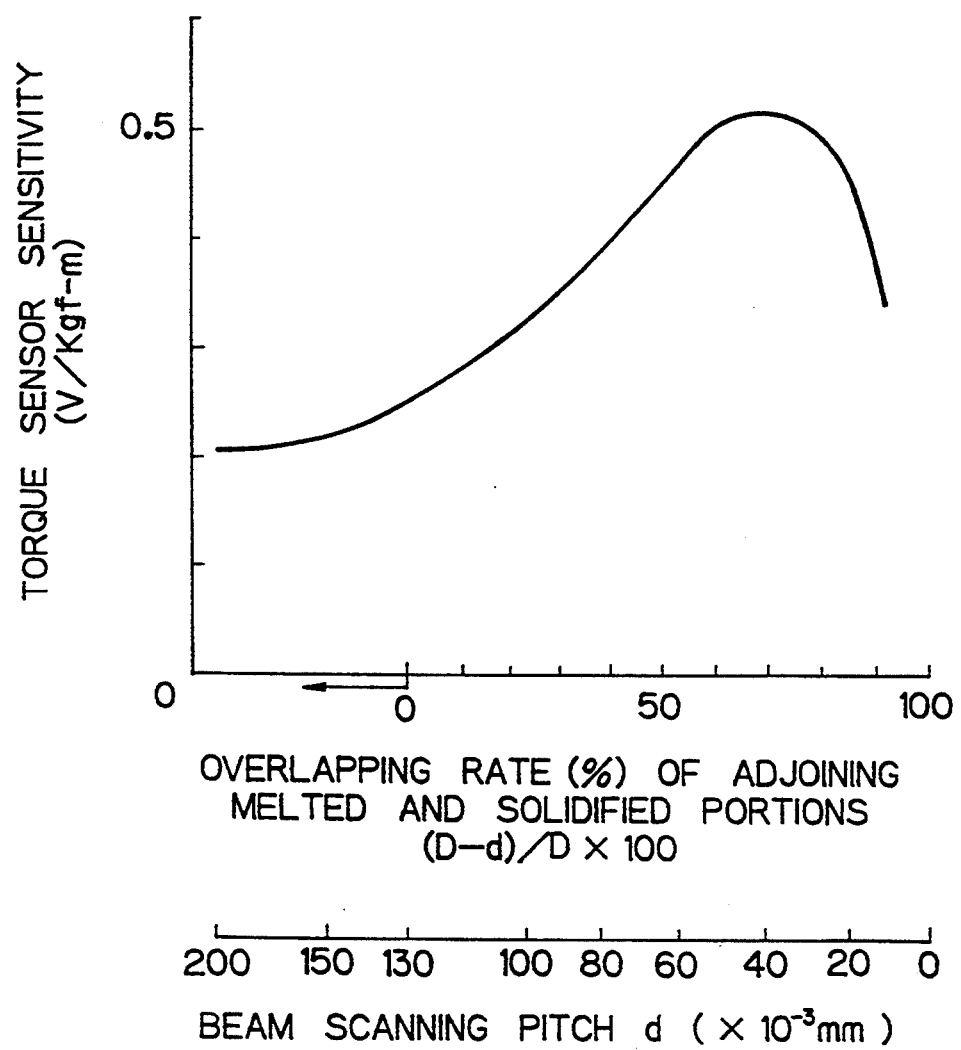
FIG. 19 shows the results of measurement showing the effect on the torque sensor sensitivity of the overlapping rate between adjoining melted and solidified portions during irradiation by a laser beam according to the present invention.

FIG. 18 is a schematic view showing the construction of a noncontact magnetostrictive type torque sensor using a shaft prepared by the above method, wherein 14 is an exciting coil and 15 is a detecting coil. FIG. 19 shows the results of measurement of the torque sensor sensitivity (output voltage/torque) for various shafts having magnetostrictive layers formed by changing the overlapping rates between adjoining melt-quenched portions by changing the scanning pitch of the laser beam. From FIG. 19, it is seen that the sensitivity changes in accordance with the overlapping rate between melt-quenched portions and that a particularly high sensitivity is obtained in the range of an overlapping rate of greater than 50% to less than 85%.

Further, the laser irradiation conditions were changed in the range of an output of 350 W to 1050 W, a defocus distance of 0 to 3.0 mm, and a beam scanning speed of 50 to 400 cm/sec to prepare various shafts. The torque sensor sensitivity on these shafts were measured in the same way as above. As a result, the thickness (depth) of the obtained melt-quenched portions changed depending on the irradiation conditions, but the range of the overlapping rate between adjoining melt-quenched portions giving a high sensitivity did not change even with a change of the irradiation conditions and became a range of greater than 50% and less than 85% in the same way as above. From this, it may be said that it is possible to control the magnetic properties of the magnetostrictive layer and improve the sensitivity of the torque sensor by controlling the overlapping rate between the adjoining melt-quenched portions during laser beam scanning to a range of greater than 50% to less than 85%.

The transmission of strain from the stainless steel shaft 11 to the magnetostrictive layer 12 at the time of torque action was measured by attaching strain gauges to the surfaces of both the magnetostrictive layer 12 and the stainless steel shaft 11, whereupon it was found that even with action of a torque of 200 N.m, the strains at the surface of the laser irradiated layer and the surface of the stainless steel completely matched and a good bonding was obtained.

Further, the structure of the magnetostrictive layer 12 formed by overlapping irradiation of the laser beam on the surface of the shaft was found to be mostly an amorphous phase from X ray diffraction.

Further, on the surface of each of these magnetostrictive layers 12, out of the portions once melted and solidified by the laser beam scanning, the portions remelted by the next adjoining laser beam scanning appeared as a line having a width corresponding to the beam scanning pitch d. The pattern formed by these lines (stripe pattern) was observed by an optical microscope. The width of the lines changed in accordance with the overlapping rate between the adjoining melted and solidified portions at the time of laser beam irradiation. At the cross-sections of these magnetostrictive layers 12, a structure with overlapping individual melt-quenched portions caused by single beam scans which changed, in accordance with the overlapping irradiation of the laser beam, was observed by an optical microscope. The distance between the deepest melted points (portions of greatest thickness in thickness melted and solidified) in the individual melt-quenched portions appearing in the cross-section corresponded to the beam scanning pitch d, and changed in accordance with the overlapping rate between adjoining melted and solidified portions at the time of laser beam irradiation.

Example 8

Figure 20:
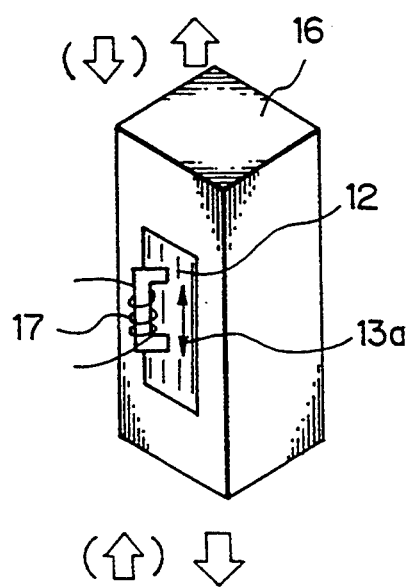
FIG. 20 is a schematic view of a method of detection of tensile strain and compressive strain according to the second aspect of the present invention.

As shown in FIG. 20, a continuous $CO_2$ laser beam 13 was irradiated on an $Fe_{78}B_{13}Si_9$ alloy layer 12a by the same preparation method as in Example 7 to form a magnetostrictive layer 12 of a size of 8 mm×30 mm including an amorphous phase on the longitudinal surface of a square columnar shaped stainless steel (SUS304) material 16 of a size of 10 mm×10 mm×40 mm. The conditions of the beam irradiation were changed in various ways in the same range as Example 7 to prepare several samples. Further, the beam scanning direction 13a was made the longitudinal direction of the stainless steel material 16.

Figure 21:
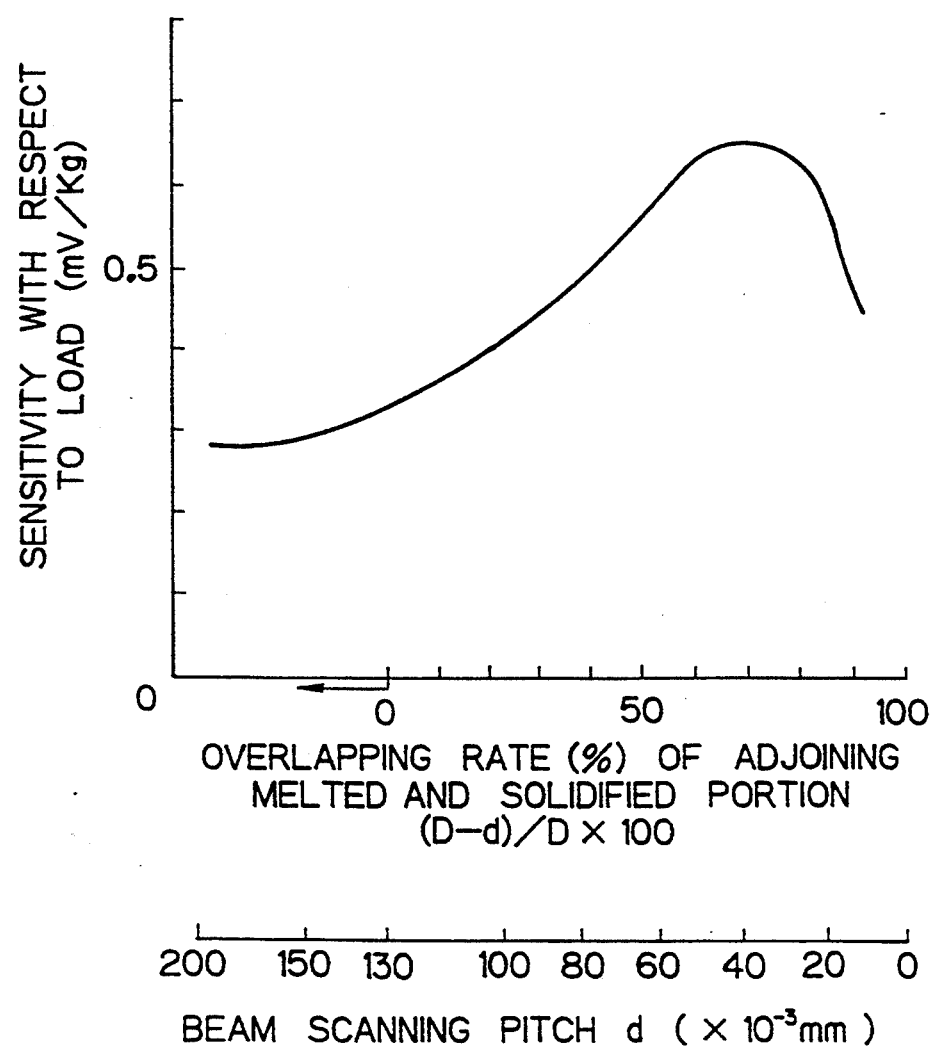
FIG. 21 shows the results of measurement showing the effect on the sensitivity of detection of the tensile strain and compressive strain of the overlapping rate between adjoining melted and solidified portions during irradiation by a laser beam according to the present invention.

These samples were placed in an Instron type testing machine and subjected to a tensile or compressive load in the longitudinal direction so as to generate elastic strain at the magnetostrictive layer 12. This was detected using the magnetostrictive effect by the method shown in FIG. 20 with a magnetic sensing portion 17 placed in a noncontact manner. FIG. 21 shows the results of measurement showing the relationship between the overlapping rate between adjoining melt-quenched portions caused by the beam scanning at the time of preparation of the magnetostrictive layer 12 and the sensitivity (output voltage/load). In this case too, in the same way as in Example 7, the sensitivity became particularly higher in the range of the overlapping rate ((D−d)/D×100 (%)) of the adjoining melt-quenched portions at the time of the laser beam scanning from greater than 50% to less than 85%. This range of the overlapping rate giving a particularly higher sensitivity did not change even when changing the laser beam output at the time of preparation, the defocus distance, and the beam scanning speed in the same range as in Example 7.

The above various samples were placed in an Instron type testing machine and alternately subjected to a tensile and compressive load in the longitudinal direction to give a strain of ±0.15% and the fatigue test was conducted. As a result, the sample with a 0% overlapping rate between the adjoining melt-quenched portions at the time of laser irradiation, that is, the one where unmelted portions were left in stripes between the adjoining melt-quenched portions, suffered from cracks parallel to the beam scanning direction in the layer surface with about $1.5 \times 10^5$ times repeated stress. As opposed to this, the samples with overlapping irradiation of the laser beam (ones where the overlapping rate between the adjoining melt-quenched portions was not 0%) did not experience cracks in the layer surface even with $5 \times 10^6$ times repeated stress, and no cracks were observed in the bonded portions with the stainless steel even when the cross-section was observed by an optical microscope.

In the case of all the samples prepared in the present example, the magnetostrictive layer formed by overlapping irradiation of the laser beam became mostly amorphous in phase in the same way as the case of the shaft prepared in Example 7. The surface and the cross-section were the same as in Example 7 in state as well.

Example 9

The overlap irradiation of the laser beam was conducted to the stainless steel shaft 1 as used in Example 5 in the same method as in Example 5, except that only the beam irradiation pitch (i.e., a distance d between the centers of beams) was changed to 100 μm.

Namely, the overlapping rate of $(D-d)/D \times 100\%$ in this case was $(130-100)/130 \times 100 \approx 23(\%)$. This is outside of the optimum range shown in Example 7, under such a condition, the heat affected zones were found.

As a result, the structure of the magnetostrictive layer 2 thus obtained is such that the amorphous phase is partitioned narrowly at a distance of about 100 μm by the heat affected zones 2d having a thin thickness including a crytalline phase.

Using a shaft formed on the surface of the above-mentioned amorphous magnetostructive layer, the torque-output characteristics were determined in the same manner as in Example 5.

As a result, a high sensitivity of 0.39 V/kgf.m was obtained. As is clear from FIG. 15, this value is remarkably larger than that of the conventional stripe-like irradiation having a beam scanning pitch of 150 μm. When a magnetostrictive layer having heat effected portions is formed, a magnetostrictive layer having a sufficiently high senstivity can be obtained even when the overlapping rate of the melt-quenched portion is outside of the scope of greater than 50% but less than 85%.

In the above embodiments, use was made of laser beams in all cases as the high energy density beams, but electron beams and other beams may be similarly used.

Further, in the first aspect of the invention, the amount of overlap of the laser beam (width of overlapping portions) should be in a range of 10% to 90% of the irradiated width (that is, the width of the melted portions). When irradiated in that range, it is possible to prepare a magnetostrictive layer comprised mainly of an amorphous alloy and having magnetic anisotropy and it is possible to produce a high sensitivity stress-strain sensor.

Further, in the first and second aspects of the invention, the process for forming on the surface of the detected member an alloy layer having a high glass-forming ability before the laser irradiation may be any method so long as a metallic bonding can be obtained even without brazing.

Further, the composition of the alloy is not limited to the Fe—B—Si system so long as the glass-forming ability is high and soft magnetic characteristics are superior and the magnetostriction coefficient is large.

Also, the shape of the detected member on which the magnetostrictive layer is formed, as clear from the examples, need not be flat, but may be curved or other shapes as well. By changing the direction of scanning of the laser beam, it is possible to detect the stress-strain in any direction.

The structure of the magnetic sensing portion may be any type so long as the magnetic excitation and detection are possible, such as a coil, magnetic head, Hall element, combination with a permanent magnet, etc.

We claim:

1. A strain sensor comprising:
   an alloy layer formed on a surface of a member in which stress is to be detected;
   an amorphous layer formed on said alloy layer, said amorphous layer having a magnetostrictive effect and being an amorphous phase of said alloy layer; and
   a crystalline layer formed in said amorphous layer, wherein a surface portion of said crystalline layer divides said amorphous layer into at least two portions.

2. A strain sensor as claimed in claim 1, wherein said amorphous magnetostrictive layer has an easy magnetization direction in a same direction as a direction of a stress desired to be detected on a surface of said member and further comprising means for detecting magnetic changes of said amorphous magnetostrictive layer.

3. A strain sensor as claimed in claim 1, wherein a width of an uppermost surface of said crystalline layer is substantially not less than any other width of said crystalline layer under said uppermost surface.

4. A strain sensor as claimed in claim 3, wherein said crystalline layer is a recrystallization phase of said amorphous layer.

5. A strain sensor as claimed in claim 4, wherein said at least two portions of said amorphous layer include a first amorphous portion parallel to a second amorphous portion, said crystalline layer being located therebetween, and said first and second amorphous portions being bridged at a lower portion of said crystalline layer.

6. A strain sensor as claimed in claim 5, wherein said first and second amorphous portions and said crystalline layer are all in a form of a stripe.

7. A strain sensor as claimed in claim 4, wherein said amorphous layer is composed of a plurality of said amorphous portions having a width of D, and said strain sensor comprises a plurality of additional crystalline layers aligned in parallel such that a pitch d exists between adjacent crystalline layers.

8. A strain sensor as claimed in claim 7, wherein an overlapping rate in said plurality of amorphous portions, which is represented by the formula:

$$(D-d)/D \times 100\%,$$

is greater than 50% and less than 85%.

9. A strain sensor comprising:
   an alloy layer formed on a surface of a member in which stress is to be detected;
   an amorphous layer formed on said alloy layer, said amorphous layer having a magnetostrictive effect and being an amorphous phase of said alloy layer; and
   a plurality of crystalline layers formed in said amorphous layer, wherein a surface portion of one of said plurality of crystalline layers divides said amorphous layer into at least two portions, wherein said amorphous layer is composed of a plurality of said amorphous portions having a width of D and said plurality of crystalline layers are aligned in parallel such that a pitch d exists between adjacent crystalline layers, and wherein an overlapping rate in said plural amorphous portions, which is represented by the formula:

$$(D-d)/D \times 100\%,$$

is greater than 50% and less than 85%.

* * * * *